United States Patent [19]

Russell

[11] Patent Number: 6,072,712

[45] Date of Patent: Jun. 6, 2000

[54] COMPACT OPTICAL RANDOM ACCESS MEMORY HAVING A REFRACTIVE-REFLECTOR LENS

[75] Inventor: James T. Russell, Bellevue, Wash.

[73] Assignee: Ioptics, Inc., Issaquah, Wash.

[21] Appl. No.: 09/311,974

[22] Filed: May 14, 1999

Related U.S. Application Data

[63] Continuation-in-part of application No. 09/180,393, Nov. 5, 1998, and a continuation of application No. PCT/US97/07967, May 8, 1997, which is a continuation-in-part of application No. 08/920,847, Aug. 29, 1997, Pat. No. 5,926,411, which is a division of application No. 08/256,202, Jun. 28, 1994, Pat. No. 5,696,714, which is a continuation-in-part of application No. 07/815,924, Dec. 30, 1991, Pat. No. 5,379,266

[60] Provisional application No. 60/017,502, May 10, 1996, and provisional application No. 60/085,715, May 15, 1998.

[51] Int. Cl.[7] .............................. G11C 13/04; G11C 11/42
[52] U.S. Cl. ............................................. 365/120; 365/127
[58] Field of Search ..................................... 365/106, 114, 365/120–124, 127

[56] References Cited

U.S. PATENT DOCUMENTS 5,559,732   9/1996   Birge ........................................ 365/120

Primary Examiner—Terrell W. Fears
Attorney, Agent, or Firm—Charles J. Rupnick

[57] ABSTRACT

A compact optical memory is disclosed in which data are stored in an optical data layer capable of selectively altering light such as by changeable transmissivity, reflectivity, polarization, and/or phase. The data are illuminated by controllable light sources and an array of multi-surface diffractive imaging lenslets which cause a data image to be projected onto an array of light sensors by reflecting, hence folding the image rays, by means of a Mangin mirror that both reflects and optically modifies the light rays to redirect them onto the sensor array located substantially coplanar with the data layer. Data are organized into an annular array of patches (called pages). By selective illumination of each data page, one of the lenslets images the selected data page onto a central image plane where the sensor array is located. Light in the data image pattern strikes different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the common sensor array, thereby enabling many stored data images to be retrieved by multiplexing at electro-optical speed.

4 Claims, 2 Drawing Sheets

COMPACT OPTICAL RANDOM ACCESS MEMORY HAVING A REFRACTIVE-REFLECTOR LENS

CROSS REFERENCE TO RELATED PATENTS AND APPLICATIONS

This is a continuation-in-part of U.S. application Ser. No. 08/920,847 filed Aug. 29, 1997, now U.S. Pat. No. 5,926,411, which is a division of U.S. application Ser. No. 08/256,202 filed Jun. 28, 1994, now U.S. Pat. No. 5,696,714 which in turn is a continuation-in-part of U.S. application Ser. No. 07/815,924 filed Dec. 30, 1991, now U.S. Pat. No. 5,379,266 all by James T. Russell; a continuation-in-part of U.S. application Ser. No. 09/180,393 filed on Nov. 5, 1998, as a national entry of of international application PCT/US97/07967 filed May 8, 1997 which is a Provisional of U.S. application Ser. No. 60/017,502 filed May 10, 1996 by Loren Laybourn, Richard E. Blahut and James T. Russell; and a Provisional of 60/085,715 filed May 15, 1998.

BACKGROUND OF THE INVENTION

The invention concerns method and apparatus of optically storing and retrieving mass digital data stored as light altering characteristics on an optical material and providing fast random access retrieval.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Solid state ROM and RAM can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U. S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or more respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

A single reflection folded path optical memory device, such as disclosed in my U.S. Pat. No. 5,436,871 reduces somewhat the system dimension along the optical axis; the direction that has been referred to as thickness or height. But it is desirable to further reduce the thickness without sacrificing performance.

The essential function of the mirror in the folded image memory is the same as a "field" lens in the above mentioned patents and applications. The mirror accepts an array of collimated beams, one from each bit, spot or mark, and directs each beam to, and focuses each beam on, the focal plane, i.e., the sensor array. It is similar to an astronomical telescope where the parabolic mirror accepts parallel ray bundles from an array of stars, and directs and focuses each star bundle on to the focal plane. If it is desired to reduce the thickness, that is, the distance from the mirror apex to the sensor plane, the focal length of the mirror must be reduced. But if it is desired to retain the same chapter capacity, i.e., retain the same size data record, several problems arise. First, the beams that are furthest off-axis will become astigmatic. This is a fundamental failing of a simple parabolic that is troublesome even in astronomical telescopes. Wide field telescopes require additional corrector elements. Second, the angle that the off-axis beams make with the sensor plane may become so large that the image will be geometrically smeared, or may even approach the sensor from the rear; obviously an ineffective configuration. The solution for an astronomical instrument is to add an additional optical element, for example, a corrector plate some distance in front of the mirror. But in the folded ORAM system, there is limited room for additional discrete elements, and the desired compression is much more severe than usually contemplated for astronomical instruments. The solution, in comparison to my original folded patent, is to make existing optical elements do multiple functions.

Accordingly, it is an object of this invention to provide an optical mass memory having random accessibility in a relatively compact size comparable to or even smaller than tape and compact disc storage mechanisms and yet still serving data processing equipment in the same manner that solid state random access memories move data into and from the processor's data bus.

SUMMARY OF THE INVENTION

In an optical data storage and retrieval system of the folded path type disclosed herein, a composite reflective and refractive lens-mirror is used to further reduce the thickness of the storage device while maintaining needed effective length of the optical path. Data are stored in an optical data layer capable of selectively altering light such as by changeable transmissivity, reflectivity, polarization, and/or phase. In the case of a transmissive data layer, data bits are stored as transparent spots on a thin layer of material and are illuminated by controllable light sources. An array of imaging lenslets project an optically enlarged image of the illuminated data onto an array of light sensors. The layer of data is organized into a plurality of regions or patches (called pages) and by selective illumination of each data page one of the lenslets images the data page onto the array of light sensors.

Transmitted page data, in this case light passed through the transparent bit locations on the data layer, and the constituent rays are folded back toward a centrally located sensor array of light detectors by the composite reflective and refractive optics. In the preferred embodiment, the composite optics is a Mangin-type lens. The thusly reflected and refracted rays strike different ones of the arrayed light detectors, outputting the stored and retrieved information in the form of electrical data signals. By selectively and sequentially illuminating different ones of the data regions (pages) on the data layer, correspondingly different data patterns are imaged by the corresponding lenslets and the composite reflective and refractive optics onto the common photosensor array, thereby enabling many data pages to be multiplexed at electro-optical speed to a data interface output associated with the photosensor array.

Embodiments of data storage and retrieval systems related to the present invention are disclosed in the above-referenced related application Ser. No. 07/815,924, now U.S. Pat. No. 5,379,266, as read-only devices, write-only devices, and read/write devices. In accordance with the preferred embodiment of the present invention, the pages or regions of data are arrayed in a substantially annular, planar pattern on a data layer that is in turn preferably bonded to an annular multi-surface lens array, also of annular configuration. Individual, selected data regions or pages are illuminated by a solid state emitter, such as an LED or laser diode. The lenslets of the multi-surface lens system array collect light from the data layer and direct it toward a substantially planar reflective surface that is disposed substantially parallel to and spaced from the annular data layer and annular lenslet array. The reflective surface both reflects and optically alters the light rays that are to form the data image. This reflection redirects and folds the image back toward the center of the annular lenslet and data arrays where the data page image is formed. To receive this reflected and hence folded image, a planar array of solid state sensors are positioned at an image plane in registration with a centered region of the data and lenslet arrays, preferably at a plane that is on the opposite side of the data layer from the reflector.

The optical prescriptions of the lenslets and composite reflective and refractive optics are designed for the folded optical path so that the data images are convergent on an imaginary axis passing through the center of the annular data and lenslet arrays. After reflection, the data image from a selected data region or page location on the data array are drawn back toward the center of the assembly to fall precisely on the detector elements of the sensor array. This configuration, in which the data are distributed in an annular array surrounding the centrally located sensor array together with the optically modifying reflector, provides for a compact optical memory assembly. A relatively large amount of data area or surface area for data is available for being imaged, on a selective page by page basis, onto the common centrally located sensor array, in a compact, efficient geometry. The optical distance available for imaging the data is essentially twice the height or thickness of the assembly, i.e., the distance between the data layer plane and the reflector plane.

In the preferred embodiment, the annular data layer and annular lenslets are affixed on a removable data/lenslet sandwich card that has an opening or optically transparent window at the center of the arrays. The data/lens card is removably inserted into a reader that houses the sources of light (emitter), sensor array, reflector and interface electronics. Further still, the preferred form of the lens surfaces of the data/lenslet sandwich card are diffractive with a computed prescription that takes into account the resolution requirements of the data as well as the location of the data images relative to the center of the annular arrays. The electronics that support the light emitters and sensors are preferably mounted adjacent to or integrated with, as by large scale integration (LSI), the emitters and/or sensors to provide further efficiencies and compactness in the overall product.

As a further aspect of the preferred embodiment, a lens element is mounted proximate to the exiting rays from the lenslet array to bend or tilt the bundle of rays toward the optical axis of the structure so that the composite reflective and refractive optics, such as preferably provided by the Mangin-type lens-mirror, requires less severe alteration of the rays to redirect them to the centrally located sensor array. This intervening lens element is preferably a diffractive surface in a transparent window between the lenslet-data card and the Mangin-type optical reflective lens structure.

Still another aspect of this preferred form of the lenslet array is that the first surface of each lenslet, i.e., adjacent the data layer, is aspherically prescribed to enhance the optical resolution of the exceedingly small and dense patch of data that is to be imaged. As indicated above, this first surface and at least one second surface of the lenslet array are preferably diffractive. The annular data layer and annular lenslet array together with the transparent immersion/bonding layer can be fabricated at a cost that allows the structure to be fabricated and effectively used as a replaceable data card.

It is therefore seen that the present invention provides an enormous data storage capability having random access speeds that approach, if not exceed, the fastest solid state RAMs and ROMs. Moreover, the organization of the data output capability of the present invention enables unusually large data words to be accessed virtually at the same instant, such as at a single clock time. Since the entire data page, when imaged on the photosensor array, conditions the array to output all of the data from that page at any given instance, the size of the output word is limited only by the number of bits in the sensor array and the addressing electronics cooperating with the sensor array. Since the array itself can be interrogated along rows and columns of data, each of which may be on the order of 1,000 bits per row or column, this allows the system of the present invention to output a data word on the order of 1,000 bits, or selected and variable portions thereof as needed. Such relatively large output words provide important applications of the present invention to such systems as computer graphics, "correlation engines" of computer based industrial systems, and other computerized or digital based systems.

These and other features, objects, and advantages of the invention will become apparent to those skilled in the art from the following detailed description and appended drawings.

DETAILED DESCRIPTION

Figure 1:
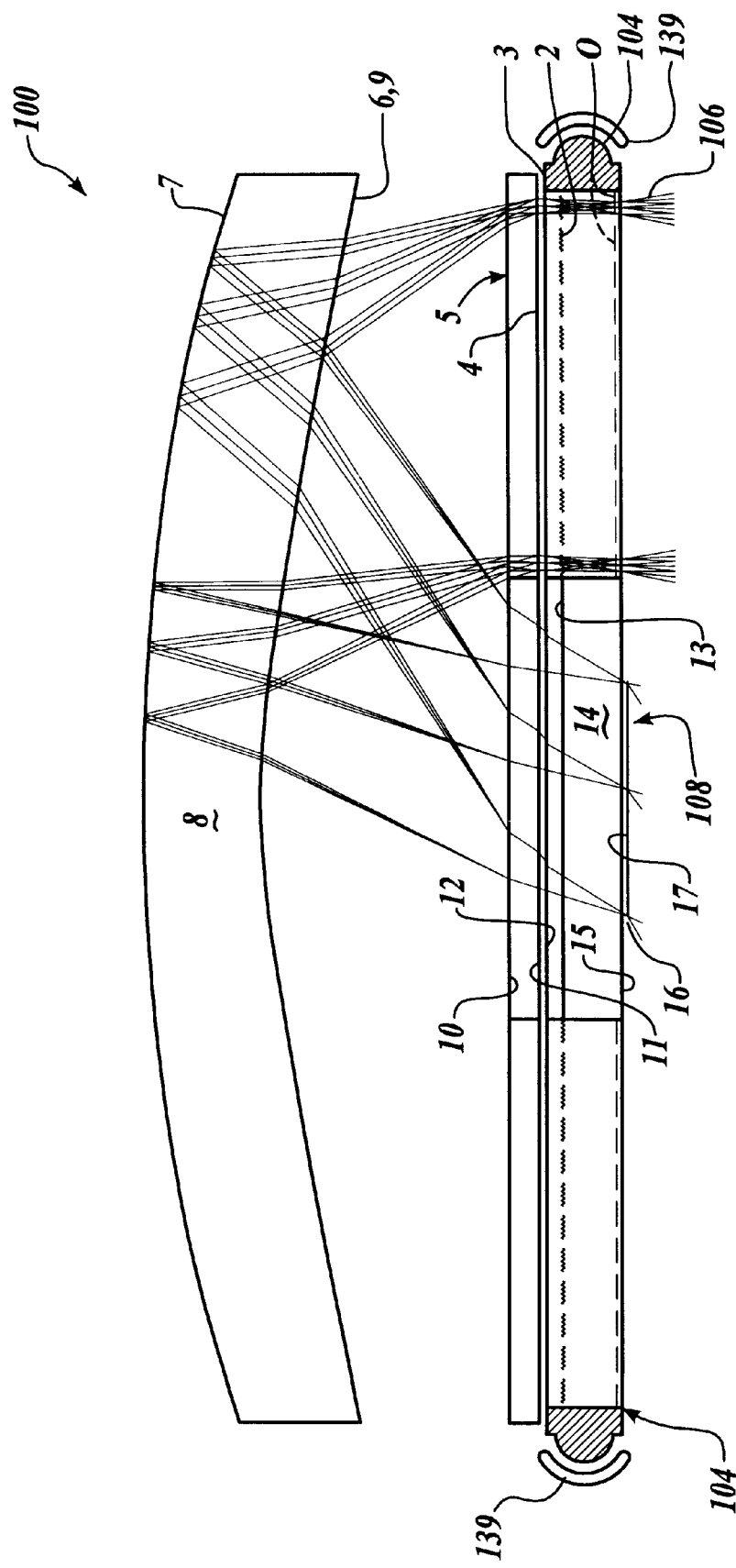
FIG. 1 is a section view taken along a vertical cutting plane of an embodiment of the optical memory having an image collector including a folding reflector in the form of a Mangin-type mirror, arrays of emitters and sensors, and a slot or spacing therebetween for receiving a data/lens sandwich card or cartridge containing annular arrayed data and superposed imaging lenslets.
Figure 2:
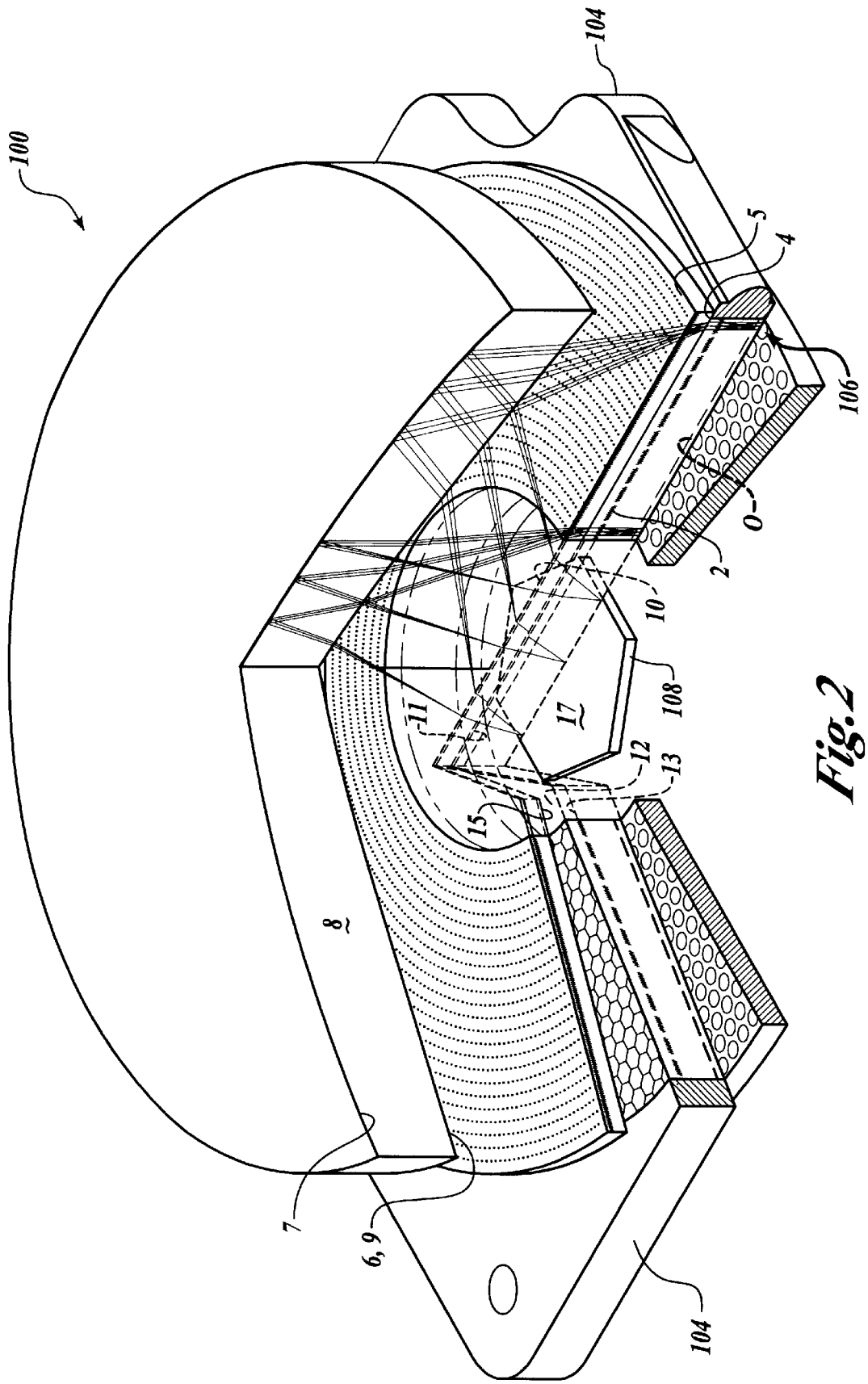
FIG. 2 is an isometric view of the memory device of FIG. 1 in which various components are cutaway in pie sections to reveal the interior configuration and optical paths of the light image forming rays.

In FIGS. 1 and 2, the rays of the data image emanating from the data lens card are folded by reflection and modified by refraction in a composite optical structure having surfaces 6,7,8,9. In this preferred embodiment the optical structure is made into a type of Mangin lens-mirror. The surface 7 of the Mangin optics remote from the data-lenslet card is reflective and contoured and the refractive lens body 8 and entry and exit surfaces 6 and 9 respectively are shaped so as to draw the image rays back toward the optical center of the data-lenslet card where the sensor array of detectors 108 is located at optical surface 17. A classic Mangin mirror is a combination of a spherical reflector, and a spherical refractive lens. The combination can be made to function as a single parabolic mirror. It was originally invented for use on searchlights, where it gave the required parabolic function, the glass lens part protected the mirror from the carbon arc, and is considerably easier to make in large sizes.

Because the field of data in the present case is relatively large, the classic parabolic surfaces are modified in the preferred embodiment to be aspheric. Making both surfaces 6 and 9 aspheric also requires corrections incorporated to give a true image hence more reliable data retrieval.

Also it is desirable to make the optical system invariant to location of the data page on the card holding the layer or film at surface 0 shown in FIG. 1. That is, if the record is inadvertently displaced laterally, it is advantageous if the image does not move. In optical memory design of this type, the rays from each point on a page are collimated before entering the optics that function as the "field" lens.

If conventional field lens optics were used, and if all page or patch lenslets have about the same focal length, all of the data pages would appear the same to the field lens subsystem, and all the constituent page images would be always directed to, and focused on the sensor array. If a page moves relative to the collection optics, the rays are still directed to the same point on the sensor. But, in the embodiment described using the Mangin-folded system, the ray bundles cannot be uniformly collimated because the entrance angles must be modified across the chapter radius. However, by placing a window having diffractive surface 4 in front of the Mangin lens-mirror, the necessary angle and focal correction is provided for the bundles or image rays as a function of device radius. The bundles of rays are thereby collimated and parfocal as they exit the data-lens sandwich card (hence before entering the diffractive surface 4 of the window), and made invariant. By these techniques, the thickness of the system can be significantly reduced as compared to previous designs.

With reference to FIGS. 1 and 2, a preferred form of the optical random access memory 100 in accordance with the invention is shown with the housing and light sources omitted for clarity and simplification. Memory 100 includes light sources (not shown), a data/lens card 104 with surfaces 0,2 respectively at the data layer and diffractive lenslets; sensor array 108 at a common effective surface 17, and interface electronics (not shown here but fully disclosed in related U.S. application Ser. No. 07/815,924, now U.S. Pat. No. 5,379,266, and international Application Ser. No. PCT/US92/11356, the published specifications of which are incorporated herein by reference). Data/lens card 104 with surfaces 0,2 is removable and in use is inserted in a slot indicated by slot guides 139 in a housing underlying a window having diffractive surface 4 and a transparent surface 11 so as to position an annular array of data regions or pages in registration with a correspondingly shaped annular array of page selection light sources (not shown). Sensor array 108 at surface 17 is fixed in the housing coaxial with the Mangin lens-mirror at surfaces 6,7,8,9 for receiving data page images sequentially selected and generated by individual ones of light sources, and reflected (hence folded) by an uppermost contoured concave reflective surface 7 of Mangin lens-mirror 6,7,8,9 overlying data/lens card 104 which is generally parallel with card slot 139 and thus in position to collect image rays of an illuminated data page or patch.

The annular configuration of the data/lens arrays on card 104 allows a substantial increase in data storage over other proposed configurations, and the reflective surface of Mangin lens-mirror 6,7,8,9 folds the data image rays back toward the center of the data/lens annulus, where the common sensor array 108 is positioned at surface 17, to yield a compact optical memory reader.

Unitary data/lens card 104 with data and diffractive lens surfaces 0,2 is fabricated as a bonded unit so that the array of lenslet systems at surface 2 is fixed in spatial relation to the data layer 0. This structure enhances the integrity of the optical registration between data and imaging lenslets so that the card is installable and replaceable as a unit while maintaining fixed spatial data-to-lens relationship.

To further enhance the readability by the sensor of the light image rays emanating from data/lens card structure 104, and representing a selected, illuminated data page, the image rays from each such page are passed through a lenslet system having at least a first optical surface 2. This optical lens surface is preferably diffractive. As described in related U.S. and PCT applications, Ser. Nos. 07/815,924 (now U.S. Pat. No. 5,379,266) and PCT/US92/11356, the lens surface 2 is placed close to the data layer 0 and is aspheric to collect a maximum amount of the data field light in each page. A second diffractive surface may be used in some applications to improve image quality.

Thus by disposing the sensor 108 beneath the data card at surface 17, the improved imaging due to refraction by the card's transparent center is accomplished together with the topology of a sensor 108 that is mounted on the same or a coplanar integrated circuit substrate as that which supports the light source array 106.

The data image projected onto sensor array 108 in this preferred embodiment is generated from pages stored in a regular x-y grid pattern as shown in FIG. 2. By illuminating selected regions or pages of the data layer, e.g., a single page, the image, as transformed by an associated lenslet system, is enlarged, bent inwardly by diffractive surface 4 toward common collector image surfaces 6,9 of the Mangin optics and shifted radially inwardly, reflected, further modified by the optical prescription of the Mangin lens-mirror 6,7,8,9 and then imaged on the sensor array 108 of light sensing elements or detectors at surface 17.

The redirection of the image rays by the optical prescription of the reflective surface 7 and refractive surfaces 6,9 of the Mangin optics serves as a type of field lens, to collect and refocus the data page image onto sensor at surface 17.

Thus, in operation, one of many pages of binary data is selected from annular data layer 0 by energizing a chosen cell of annular arrayed light sources indicated at 106. This causes data page light rays to emanate toward and be reflected by Mangin optics 6,7,8,9 which distributes the data bit rays that become the page image to strike the arrayed photosensing detection elements of the sensor array. The data page image has roughly the shape of a circle or many sided regular polygon and fills the image plane on the upper surface 17 of the sensor array. The individual data bits within a single data page are here arranged in closely spaced rows and columns and at densities that use to advantage high resolution optical films and other record media including but not limited to photochemical films.

As described in related U.S. application Ser. No. 07/815,924, now U.S. Pat. No. 5,379,266, and international Application Ser. No. PCT/US92/11356, the data may be recorded onto surface 0 that is the data layer by photochemical processes using a page composer and imaging optics to successively expose each page or region on the data layer to a field of data light bits, by direct photographic reproduction including contact printing and/or molding or embossing from a master as in the case of conventional compact disc records. The data bits are in a size range of 2.25 to 0.5 microns and a center-to-center spacing also in that range. Each data page is formed by the amount of individual data bits that can be collected and grouped into a cell and at the preferred density range of $2 \times 10^7 - 4 \times 10^8$ bits per $cm^2$, it has been found that about 150 thousand bits of data per page (or region) is an advantageous quantity that results in the generation of a data image after magnification that can be reliably sensed by photosensitive elements of sensor array 108. In this case, the preferred embodiment provides an optical image enlargement through the various lenslet systems and field lens effect of surfaces 6,7,8,9 of approximately 20 to 30 times data density on layer 0. Thus, assuming a mean magnification of 25×, the spacing of the projected image elements on the sensor array at surface 17 is on the order of 25 microns. A multi-sided or roughly circular cell for sensing a page of data may thus contain one million data bit sensor elements, assuming that a sampling ratio of 2×2 subarray of detector pixels are used for each effective image bit, and that a suitable guard band is provided at the sensor.

The particular structure and operation of the sensor array 108 and various alternatives to the preferred embodiment are described in greater detail in related U.S. application Ser. No. 07/815,924, now U.S. Pat. No. 5,379,266, and international Application Ser. No. PCT/US92/11356. Briefly, each data bit which may be represented by a spot of light from the imaged page, causes a photosensitive element of sensor array 108 to either conduct or nonconduct depending on whether the data is a "1" or a "0" bit. Although different forms of data layer may be employed, in the present preferred embodiment data layer at surface 0 is a light transmissive mask or film in which binary "1" bits are transmissive while binary "0" bits are opaque or light blocking.

In the particular embodiments of FIGS. 1–2, the major radius of the assembled collection of data pages in layer 0 is about 25 mm, and the minor radius of the annulus about 8.5 mm. The sensor is about 10 mm diameter. This provides about five times as many pages as would have been the case without an imaging folding mirror, but with the same height. Alternatively, the height is about half what it would have been for the same data chapter size, collectively all pages.

TABLE

EXAMPLES OF LENS AND REFLECTOR PRESCRIPTIONS FOR ORAM 100

LENS DATA for FIG. 1
One Reflection System with Mangin type Mirror

| SURFACE | RADIUS | THICKNESS | APERTURE RADIUS | GLASS | NOTE |
|---|---|---|---|---|---|
| 0 | — | 0.100000 | 0.200000 | ULTEM | Data Surface |
| 1 | — | 1.766391 | 0.260000 | ULTEM | |
| 2 | — | 0.500000 | 0.260000 AK | ACRYLIC | Diff. Lens |
| 3 | — | 0.250000 | 0.260000 | AIR | |
| 4 | — | 1.000000 | 21.000000 | ACRYLIC | Diff. Window |
| 5 | — | 8.383629 | 21.000000 P | AIR | |
| 6 | -21.714598 | 4.000000 | 21.000000 P | BK7 | |
| 7 | -79.222200 | — | 21.000000 P | REFLECT | Mirror |
| 8 | — | -4.000000 P | 21.000000 P | BK7 | |
| 9 | -21.714598 P | -8.383629 P | 21.000000 P | AIR | |
| 10 | — | -1.000000 | 7.500000 | ACRYLIC | Clear Window |
| 11 | — | -0.250000 | 7.500000 P | AIR | |
| 12 | — | -0.500000 | 7.500000 P | ACRYLIC | |
| 13 | — | -1.866391 P | 7.500000 P | ULTEM | |
| 14 | — | -0.100000 | 7.500000 P | AIR | |
| 15 | — | -0.100000 | 4.000000 | BK7 | |
| 16 | — | — | 4.000000 | AIR | |
| 17 | — | — | 4.000000 | | Sensor |

CONIC AND POLYNOMIAL ASPHERIC DATA

| SURFACE | Conic Const. |
|---|---|
| 6 | -25.754811 |
| 7 | 6.468963 |

TABLE-continued

EXAMPLES OF LENS AND REFLECTOR PRESCRIPTIONS FOR ORAM 100

| | | 9 | | | −25.754811 | | | |
|---|---|---|---|---|---|---|---|---|

DIFFRACTIVE SURFACE DATA

| 2 | DOE DFX | 8 - ASYMMETRIC DIFFRACTIVE SRF | | | DOR | 1 | DWV | 0.645000 |
|---|---|---|---|---|---|---|---|---|
| | | | | | KCO | 1 | KDP | — |
| | DF0 | — | DF1 | — | DF2 | −3.2093e−05 | DF3 | −0.442292 |
| | DF4 | — | DF5 | −0.438101 | DF6 | — | DF7 | 0.000861 |
| | DF8 | — | DF9 | 0.000560 | DF10 | 0.045746 | DF11 | — |
| | DF12 | 0.039952 | DF13 | — | DF14 | 0.009346 | DF15 | — |
| | DF16 | — | DF17 | — | DF18 | — | DF19 | — |
| | DF20 | −0.005878 | DF21 | — | DF22 | — | DF23 | −0.206938 |
| | DF24 | — | DF25 | −0.082237 | DF26 | — | DF27 | −0.008902 |
| 2 | DOE DFX | 8 - ASYMMETRIC DIFFRACTIVE SRF | | | DOR | 1 | DWV | 0.645000 |
| | | | | | KCO | 1 | KDP | — |
| | DF0 | — | DF1 | −0.026974 | DF2 | 1.9399e−05 | | |

REFRACTIVE INDICES

| SRF | GLASS | RN1 | RN2 | RN3 | VNBR | TCE |
|---|---|---|---|---|---|---|
| 0 | ULTEM | 1.650783 | 1.652245 | 1.649365 | 225.975134 | — |
| 2 | ACRYLIC | 1.488490 | 1.488924 | 1.488069 | 571.701364 | — |
| 6 | BK7 | 1.514682 | 1.515014 | 1.514362 | 789.290885 | 71.000000 |

WAVELENGTHS

| CURRENT | WV1/WW1 | WV2/WW2 | WV3/WW3 |
|---|---|---|---|
| 1 | 0.645000 | 0.635000 | 0.655000 |
| | 1.000000 | 0.500000 | 0.500000 |

Data in these tables describe a lens set prescription and Mangin reflector-lens that would be effective for a page at the outer edge of the record element. This is the optically most difficult location. Preferably, data pages that are closer to the center have revised prescriptions for the lenses, computed using a conventional lens design program such as the one mentioned below, and inputting the radial offsets for the interior lenslets. The spacings and the reflector remain the same.

A commercial lens design program called OSLO6 was used to do the design shown in the table. The program is a product of Sinclair Optics, Inc., Fairport, N.Y.

While only particular embodiments have been disclosed herein, it will be readily apparent to persons skilled in the art that numerous changes and modifications can be made thereto, including the use of equivalent means, devices, and method steps without departing from the spirit of the invention.

I claim:

1. An optical data system comprising:

a substantially planar optical data means for storing data as light altering characteristics and being organized into a plurality (P) of juxtaposed data regions each having capacity to store (B) bits of data and arrayed in a planar annular pattern having a light transmissive window substantially centered with respect to said annular pattern;

controllable light source means disposed proximate a first side of said planar optical data means for selectively illuminating at least one of said separate data regions of said optical data means;

data imaging lens optics arranged in such proximity to and in optical registration with said juxtaposed data regions so that the image resolving power thereof is substantially uniform over the field of view of that data region to form an image thereof on a common image surface;

a composite refractive and reflective optical device surface spaced from and generally parallel to and in optical alignment with a second side of said planar optical data means for refracting and reflecting a data image of each of said data regions back and inwardly toward said center of said annular pattern;

sensor means having a plurality (S) of juxtaposed light sensors arranged proximate said planar optical data means in registration with said transmissive window to provide said common image surface for sensing data as a light image corresponding to an illuminated data region; and data signal output means coupled to said sensor means for outputting data signals representing said data of an illuminated and imaged data region.

2. The optical data system of claim 1, wherein said composite refractive and reflective device is a Mangin mirror.

3. The optical data system of claim 1, further comprising a diffractive window element disposed between the second surface of said data means and said composite refractive and reflective device for correcting imaging of data ray bundles prior to striking said sensor means.

4. The optical data system of claim 1, wherein said sensor means is generally coplanar with said data record means.

* * * * *